(12) United States Patent
Lee et al.

(10) Patent No.: US 8,658,883 B2
(45) Date of Patent: Feb. 25, 2014

(54) SOLAR CELL MODULE AND METHOD FOR MANUFACTURING THE SAME

(75) Inventors: Kang-Hee Lee, Hwaseong-si (KR); Byoung-Dong Kim, Asan-si (KR); Se-Jin Chung, Yongin-si (KR); Gug-Il Jun, Hwaseong-si (KR); Woo-Su Lee, Yongin-si (KR); Byung-Joo Lee, Seoul (KR)

(73) Assignees: Samsung SDI Co., Ltd., Yongin-Si, Gyeonggi-Do (KR); Samsung Display Co., Ltd., Yongin, Gyeonggi-Do (KR)

( * ) Notice: Subject to any disclaimer, the term of this patent is extended or adjusted under 35 U.S.C. 154(b) by 818 days.

(21) Appl. No.: 12/618,643

(22) Filed: Nov. 13, 2009

(65) Prior Publication Data

US 2010/0186796 A1 Jul. 29, 2010

(30) Foreign Application Priority Data

Jan. 29, 2009 (KR) ........................ 10-2009-0007141

(51) Int. Cl.
*H01L 31/042* (2006.01)

(52) U.S. Cl.
USPC .......................................... 136/244; 136/249

(58) Field of Classification Search
USPC .................................................. 136/244, 249
See application file for complete search history.

(56) References Cited

U.S. PATENT DOCUMENTS

| | | | |
|---|---|---|---|
| 4,805,006 A * | 2/1989 | Yamaguchi et al. ......... | 257/436 |
| 5,593,901 A | 1/1997 | Oswald et al. | |
| 5,660,643 A | 8/1997 | Toggweiler | |
| 5,928,437 A * | 7/1999 | Dillard ........................... | 136/244 |
| 7,098,395 B2 * | 8/2006 | Hiraishi et al. ................ | 136/251 |
| 2002/0139411 A1 | 10/2002 | Hiraishi et al. | |
| 2006/0196536 A1* | 9/2006 | Fujioka et al. ................. | 136/244 |
| 2007/0163646 A1* | 7/2007 | Kushiya et al. ............... | 136/264 |

FOREIGN PATENT DOCUMENTS

| | | |
|---|---|---|
| EP | 427934 A2 | 5/1991 |
| EP | 1246249 A2 | 10/2002 |
| JP | 2005-191167 A | 7/2005 |
| WO | WO 95/01654 A1 | 1/1995 |

OTHER PUBLICATIONS

European Search Report Dated Feb. 8, 2013.

* cited by examiner

*Primary Examiner* — Jonathan Johnson
*Assistant Examiner* — Dujuan Horton
(74) *Attorney, Agent, or Firm* — Lee & Morse, P.C.

(57) ABSTRACT

A solar cell module is provided. The solar cell module includes: a substrate; a plurality of unit cells including a first electrode, a semiconductor layer, and a second electrode that are sequentially deposited on the substrate; a first sub-module and a second sub-module having the unit cells, respectively; a first longitudinal pattern dividing the unit cells of the first sub-module, and a second longitudinal pattern dividing the unit cells of the second sub-module; a transverse pattern dividing the first sub-module and the second sub-module; and an insulating portion disposed near the transverse pattern, and insulating between the first sub-module and the second sub-module, wherein the unit cells of the first sub-module are connected in series through the first longitudinal pattern, the unit cells of the second sub-module are connected in series through the second longitudinal pattern, and the first sub-module and the second sub-module are connected in series through the transverse pattern.

9 Claims, 13 Drawing Sheets

SOLAR CELL MODULE AND METHOD FOR MANUFACTURING THE SAME

CROSS-REFERENCE TO RELATED APPLICATION

This application claims priority to and the benefit of Korean Patent Application No. 10-2009-0007141 filed in the Korean Intellectual Property Office on Jan. 29, 2009, the entire contents of which are incorporated herein by reference.

BACKGROUND OF THE INVENTION (a) Field of the Invention

The present invention relates to a solar cell module and a manufacturing method thereof.

(b) Description of the Related Art

A solar cell converts light energy (e.g., sunlight) into electrical energy. A photovoltaic solar cell is a diode having a PN junction, and are classified into various kinds according to the materials used as the light absorption layer.

A solar cell using silicon as the light absorption layer may be classified as a crystalline wafer solar cell and an a-Si thin film solar cell. Other thin-film solar cells include a compound thin film solar cell using CIGS (CuInGaSe2) or CdTe, a III-V group solar cell, a dye response solar cell, and an organic solar cell.

A photovoltaic solar cell has a uniform open circuit voltage (Voc) regardless of its size, and a solar cell module obtains a desired voltage by connecting many unit cells in series in a patterning process. The patterned region is a dead region that does not generate electricity under illumination, such that the larger the patterned area is, the less efficient the solar cell module is.

The above information disclosed in this Background section is provided for enhancement of understanding of the invention and therefore it may contain information that does not form the prior art that is already known in this country to a person of ordinary skill in the art.

SUMMARY OF THE INVENTION

The present invention reduces the dead region of a solar cell module while maintaining the same output voltage, thereby increasing efficiency.

A solar cell module according to the present invention includes: a substrate; a plurality of unit cells including a first electrode, a semiconductor layer, and a second electrode that are sequentially deposited on the substrate; a first sub-module and a second sub-module having the unit cells, respectively; a first longitudinal pattern dividing the unit cells of the first sub-module, and a second longitudinal pattern dividing the unit cells of the second sub-module; a transverse pattern dividing the first sub-module and the second sub-module; and an insulating portion disposed near the transverse pattern, and insulating between the first sub-module and the second sub-module, wherein the unit cells of the first sub-module are connected in series through the first longitudinal pattern, the unit cells of the second sub-module are connected in series through the second longitudinal pattern, and the first sub-module and the second sub-module are connected in series through the transverse pattern.

The first longitudinal pattern and the second longitudinal pattern may respectively include: a first pattern region patterned in a longitudinal direction to pass through the first electrode; a second pattern region patterned in the longitudinal direction to pass through the semiconductor layer; and a third pattern region patterned in the longitudinal direction to pass through the semiconductor layer and the second electrode.

The transverse pattern may include: a fourth pattern region patterned in a transverse direction to pass through the first electrode; a fifth pattern region patterned in the transverse direction to pass through the semiconductor layer; and a sixth pattern region patterned in the transverse direction to pass through the semiconductor layer and the second electrode.

The insulating portion may include a first insulating portion disposed on a straight line with the fourth pattern region and a second insulating portion disposed on a straight line with the sixth pattern region.

The first pattern region, the second pattern region, and the third pattern region may be sequentially disposed according to the transverse direction in the first sub-module and the second sub-module, respectively.

A first unit cell of the edge of the first sub-module and a second unit cell of the edge of the second sub-module separated from the first unit cell may be connected in series through the transverse pattern.

The first unit cell of the edge of the first sub-module and the second unit cell of the edge of the second sub-module may be separated from each other along a diagonal direction.

The first unit cell of the edge of the first sub-module and a second unit cell of the edge of the second sub-module neighboring the first unit cell may be connected in series through the transverse pattern.

The first sub-module may include first to N-th unit cells that are sequentially disposed, and the second sub-module may include (N+1)-th to 2N-th unit cells that are sequentially disposed.

The first to N-th unit cells and the (N+1)-th to 2N-th unit cells may be sequentially disposed in the same direction, and the N-th unit cell and the (N+1)-th unit cell may be connected in series through the transverse pattern.

The insulating portion may include a first insulating portion near the first sub-module, and a second insulating portion near the second sub-module.

The first insulating portion may be disposed from the first unit cell to the (N−1)-th unit cell, and the second insulating portion may be disposed from the (N+2)-th unit cell to 2N-th unit cell.

The unit cells may have the same area.

Another solar cell module according to the present invention includes: a substrate; a plurality of unit cells including a first electrode, a semiconductor layer, and a second electrode that are sequentially deposited on the substrate; a first sub-module and a second sub-module having the unit cells, respectively; a first longitudinal pattern dividing the unit cells of the first sub-module, and a second longitudinal pattern dividing the unit cells of the second sub-module; an insulating portion insulating the first sub-module and the second sub-module between the first sub-module and the second sub-module; and a connection cell connecting between a first unit cell of the edge of the first sub-module and a second unit cell of the edge of the second sub-module, wherein the unit cells of the first sub-module are connected in series through the first longitudinal pattern, and the unit cells of the second sub-module are connected in series through the second longitudinal pattern.

The connection cell may be disposed neighboring and parallel to the second unit cell, and a portion of the connection cell is extended to neighbor to the first unit cell.

The first longitudinal pattern and the second longitudinal pattern may include: a first pattern region patterned in a longitudinal direction to pass through the first electrode; a second pattern region patterned in the longitudinal direction to pass through the semiconductor layer; and a third pattern region patterned in the longitudinal direction to pass through the semiconductor layer and the second electrode.

The first to third pattern regions of the first sub-module and the first to the third pattern regions of the second sub-module may be sequentially disposed in different directions.

The first sub-module may include the first to N-th unit cells that are sequentially disposed, and the second sub-module includes the (N+1)-th to 2N-th unit cells that are sequentially disposed.

The first to N-th unit cells may be sequentially disposed in a first direction, the (N+1)-th to 2N-th unit cells may be sequentially disposed in a direction opposite to the first direction, and the N-th unit cell and the (N+1)-th unit cell may be connected in series through the connection cell.

Another solar cell module according to the present invention includes: a substrate; a plurality of unit cells including a first electrode, a semiconductor layer, and a second electrode that are sequentially deposited on the substrate; a first sub-module and a second sub-module having the unit cells, respectively; a first longitudinal pattern dividing the unit cells of the first sub-module, and a second longitudinal pattern dividing the unit cells of the second sub-module; an insulating portion insulating the first sub-module and the second sub-module between the first sub-module and the second sub-module; and an assistance pattern connecting the first sub-module and the second sub-module to each other in series, wherein the unit cells of the first sub-module are connected in series through the first longitudinal pattern, and the unit cells of the second sub-module are connected in series through the second longitudinal pattern.

The assistance pattern may be disposed between the first sub-module and the second sub-module.

The assistance pattern may be disposed in the transverse direction.

The first sub-module may include the first to N-th unit cells that are sequentially disposed, and the second sub-module includes the (N+1)-th to 2N-th unit cells that are sequentially disposed.

The first to N-th unit cells and the (N+1)-th to 2N-th unit cells may be sequentially disposed according to the same direction, and the N-th unit cell and the (N+1)-th unit cell may be connected in series through the assistance pattern.

The assistance pattern may include a first pattern region formed near the first sub-module, a second pattern region formed near the second sub-module, a third pattern region formed between the first pattern region and the second pattern region, the first pattern region may be disposed from the first unit cell to the N-th unit cell, and the second pattern region may be disposed from the (N+2)-th unit cell to the 2N-th unit cell.

The first pattern region and the second pattern region may be patterned in the transverse direction to pass through the first electrode, and the third pattern region may be patterned to pass through the semiconductor layer.

The insulating portion may include a first insulating portion disposed on a straight line with the first pattern region and a second insulating portion disposed on a straight line with the second pattern region, the first insulating portion may be disposed from the first unit cell to the (N-1)-th unit cell, and the second insulating portion may be disposed from the (N+2)-th unit cell to 2N-th unit cell.

The assistance pattern may be formed on one of the first unit cell disposed on the edge of the first sub-module and the second unit cell disposed on the edge of the second sub-module, and the assistance pattern may connect the first unit cell and the second unit cell to each other in series.

The first unit cell and the second unit cell may be next to each other.

The first sub-module may include the first to N-th unit cells that are sequentially disposed, and the second sub-module includes the (N+1)-th to the 2N-th unit cells that are sequentially disposed.

The first to N-th unit cells may be sequentially disposed in a first direction, the (N+1)-th to the 2N-th unit cells may be sequentially disposed in a direction opposite to the first direction, and the N-th unit cell and the (N+1)-th unit cell may be connected in series through the assistance pattern.

As the result of the present invention, the design pattern is modified such that the first sub-module and the second sub-module are connected in series, and thereby the light efficiency may be increased and the manufacturing cost may be reduced.

DESCRIPTION OF REFERENCE NUMERALS INDICATING PRIMARY ELEMENTS IN THE DRAWINGS 100, 200, 300 substrate 110, 210, 310 first electrode
120, 220, 320 p layer 130, 230, 330 n layer
140, 240, 340 semiconductor layer
150, 250, 350 second electrode
P1, P2, P3, P4, P5, P6 first to third pattern regions
C1, G2, G3, G4 first to fourth grooves
SUB1, SUB2 first and second sub-modules
VP1, VP2 first and second longitudinal patterns
HP transverse pattern SP assistance pattern

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

Figure 1:
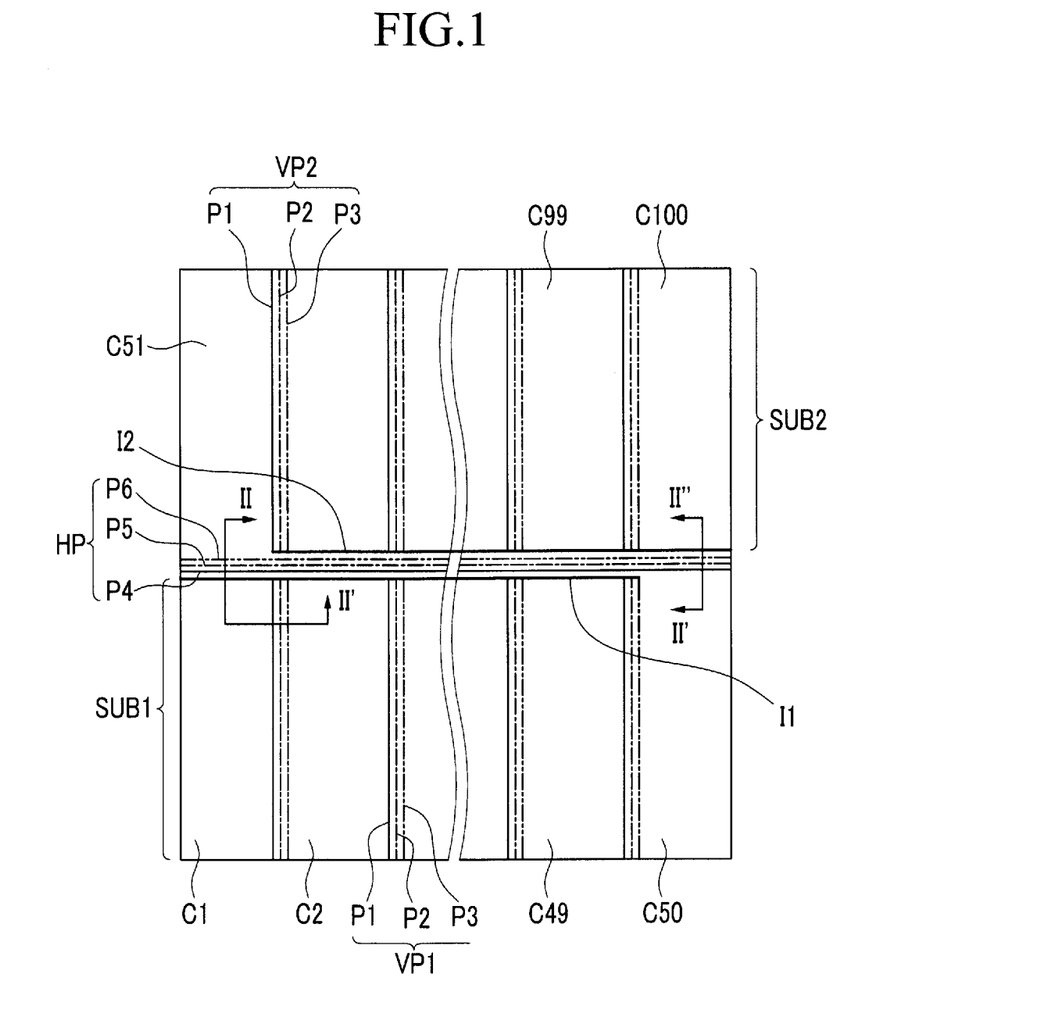
FIG. 1 is a layout view of a solar cell module according to an exemplary embodiment of the present invention.
Figure 2:
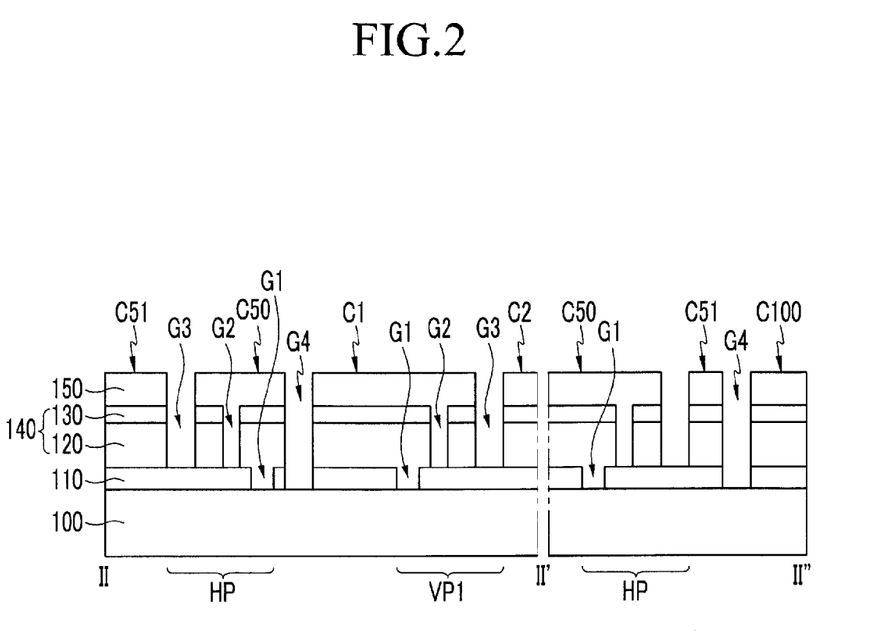
FIG. 2 is a cross-sectional view taken along the lines II-II' and II'-II'' of FIG. 1.

FIG. 1 is a layout view of a solar cell module according to an exemplary embodiment of the present invention. FIG. 2 is a cross-sectional view taken along the lines II-II' and II'-II" of FIG. 1.

A thin film solar cell module may be made by connecting an upper electrode of one unit cell and a lower electrode of a neighboring unit cell, the unit cell consisting of a PN junction made of a P-type semiconductor and an N-type semiconductor between the upper electrode and the lower electrode.

The upper electrode and the lower electrode may be connected to each other through several patterning processes.

Referring to FIG. 1 and FIG. 2, a first electrode 110 is disposed on a substrate 100 made of glass or plastic. A first groove G1 is formed passing through the first electrode 110. A semiconductor layer 140 filled in the first groove G1 may be disposed on the first electrode 110. A second groove G2 is formed passing through the semiconductor layer 140. A second electrode 150 filled in the second groove G2 may be disposed on the semiconductor layer 140. A third groove G3 is formed passing through the second electrode 150 and the semiconductor layer 140.

The first electrode 110 may be made of $SnO_2$, ZnO:Al, ZnO:B, indium tin oxide (ITO), or indium zinc oxide (IZO).

In detail, the first groove G1 is disposed in a first pattern region P1 extending in a longitudinal direction and a fourth pattern region P4 extending in a transverse direction. The second groove G2 is disposed in a second pattern region P2 extending in the longitudinal direction and a fifth pattern region P5 extending in the transverse direction. The third groove G3 is disposed in a third pattern region P3 extending in the longitudinal direction and a sixth pattern region P6 extending in the transverse direction.

A solar cell module connects a plurality of unit cells C1, C2, . . . , C100 in series to achieve a desired voltage. Grooves are patterned into the layers to either isolate or connect electrodes from different unit cells. The first groove G1 has a function of insulating the first electrode 110, and the second groove G2 has a function of electrically connecting the first electrode 110 (a lower electrode) to the second electrode 150 (an upper electrode). The third groove G3 has a function of insulating the neighboring unit cells from each other. A solar cell module according to an exemplary embodiment of the present invention may be divided into a first sub-module SUB1 and a second sub-module SUB2. In the first sub-module SUB1, a first pattern region P1, a second pattern region P2, and a third pattern region P3 make up the first longitudinal pattern VP1. In the second sub-module SUB2, a first pattern region P1, a second pattern region P2, and a third pattern region P3 make up the second longitudinal pattern VP2. In the first longitudinal pattern VP1 and the second longitudinal pattern VP2, the first pattern region P1, the second pattern region P2, and the third pattern region P3 are sequentially disposed in the same direction.

The first sub-module SUB1 and the second sub-module SUB2 include a plurality of unit cells C1, C2, . . . , C100. The unit cells C1, . . . , C50 of the first sub-module are divided by a first longitudinal pattern VP1, and the unit cells C51, . . . , C100 of the second sub-module are divided by a second longitudinal pattern VP2. The first sub-module SUB1 and the second sub-module SUB2 are divided by a transverse pattern HP. The first longitudinal pattern VP1 and the second longitudinal pattern VP2 are separated from each other, and the transverse pattern HP is disposed therebetween.

The unit cells C1, . . . , C50 of the first sub-module SUB1 are connected to each other in series through the first longitudinal patterns VP1, and the unit cells C51, . . . , C100 of the second sub-module SUB2 are connected to each other in series through the second longitudinal patterns VP2.

A first insulating pattern I1 and a second insulating pattern I2 are formed near the transverse pattern HP. The first and second insulating patterns I1 and I2 have a function of electrically insulating between the first sub-module SUB1 and the second sub-module SUB2. However, as shown in FIG. 1, the first insulating pattern I1 is not formed in the unit cell C50 at the edge of the first sub-module SUB1, and the second insulating pattern I2 is not formed in the unit cell C51 at the edge of the second sub-module SUB2. Accordingly, the unit cell C50 at the edge of the first sub-module SUB1 is connected in series to the unit cell C51 at the edge of the second sub-module SUB2.

The insulating patterns I1 and I2 have a fourth groove G4 passing through the second electrode 150, the semiconductor layer 140, and the first electrode 110.

The semiconductor layer 140 includes a p layer 120 having a P-type impurity and an n layer 130 having an N-type impurity that are sequentially deposited. The p layer 120 may be made of $CuInSe_2$ (CIS) or $CuInGaSe_2$ (CIGS), and the n layer 130 may be made of CdS. However, differently from an exemplary embodiment of the present invention, the p layer 120 of the semiconductor layer 140 may also be made of one of the following: amorphous silicon (a-Si:H) doped with boron, amorphous silicon carbide (a-SiC:H), and a microcrystalline silicon (mc-Si:H). The n layer 130 may be made of amorphous silicon (a-Si:H). Here, an I layer (not shown) made of an amorphous material may be formed between the p layer 120 and the n layer 130.

Figure 3:
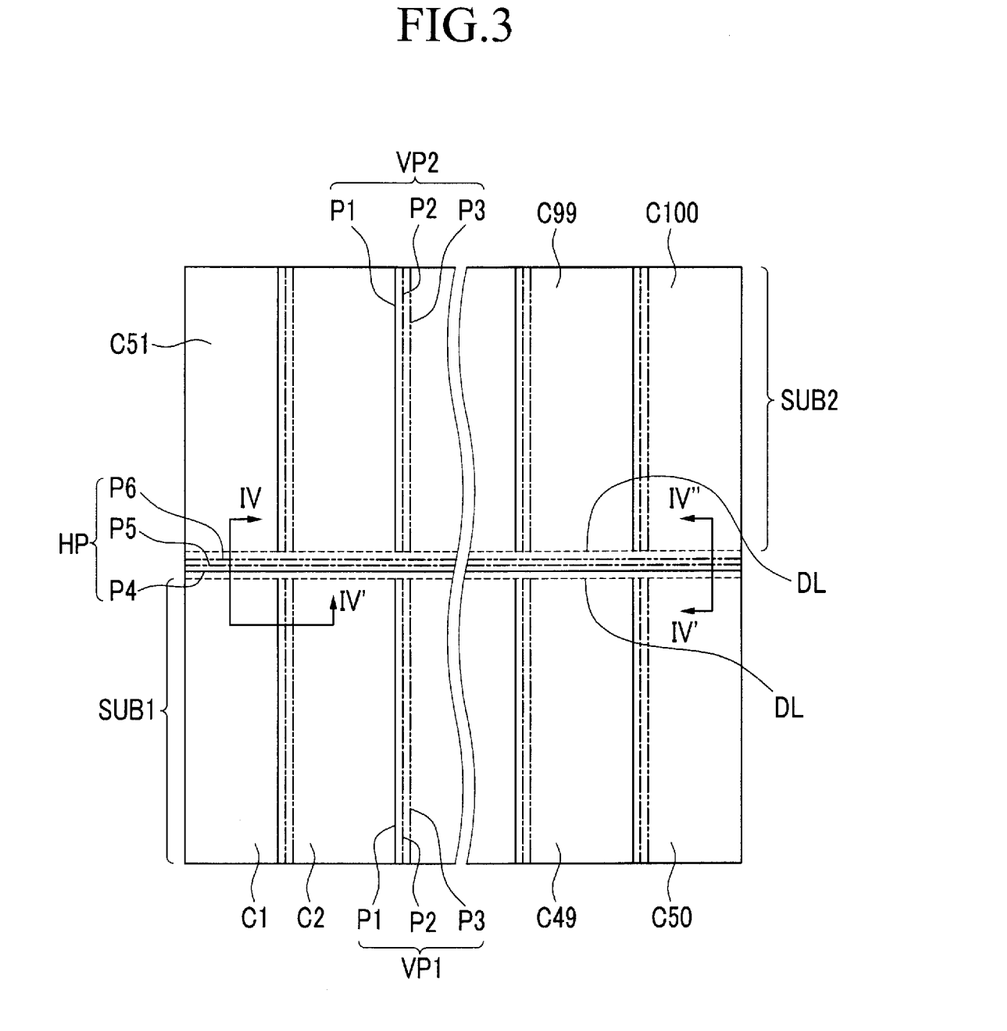
FIG. 3 is a layout view of a solar cell module in a manufacturing method according to the exemplary embodiment of FIG. 1.
Figure 4:
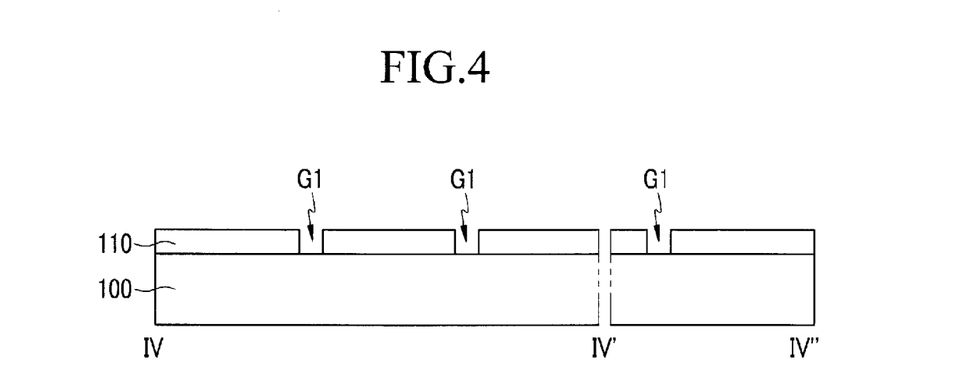
FIG. 4 to FIG. 6 are cross-sectional views taken along the lines IV-IV' and IV'-IV''' of FIG. 3.
Figure 5:
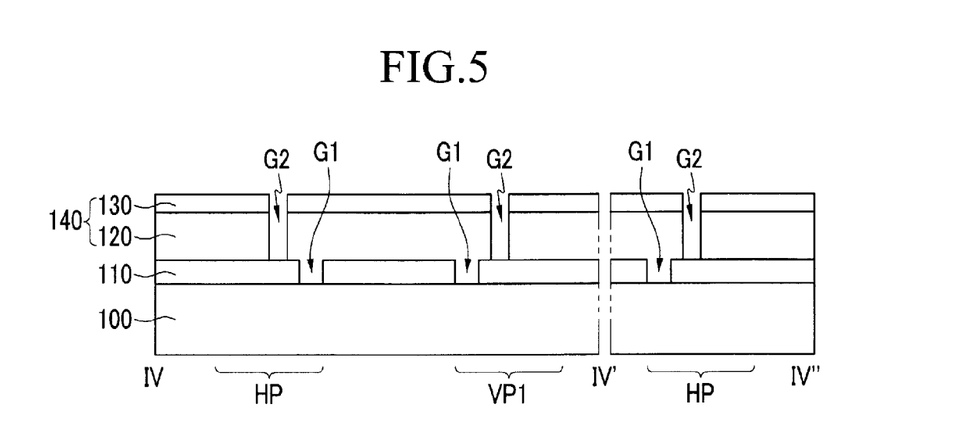
Figure 6:
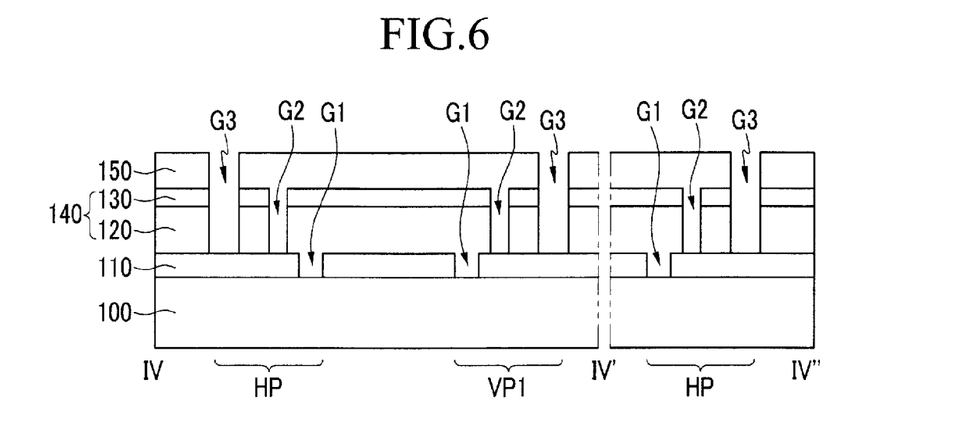

FIG. 3 is a layout view of a solar cell module in a manufacturing method according to the exemplary embodiment of FIG. 1. FIG. 4 to FIG. 6 are cross-sectional views taken along the lines IV-IV' and IV'-IV" of FIG. 3.

Referring to FIG. 3 and FIG. 4, the first electrode 110 is deposited on the substrate 100 by using a sputtering method. Next, the first electrode 110 is patterned through a laser scribing method or a mechanical scribing method to form the first groove G1. The first groove G1 is respectively formed in the first pattern region P1 of the first longitudinal pattern VP1 and the second longitudinal pattern VP2, and in the fourth pattern region P4 of the transverse pattern HP.

Referring to FIG. 3 and FIG. 5, the semiconductor layer 140 to be filled in the first groove G1 is formed on the first electrode 110. Next, the semiconductor layer 140 is patterned through a laser scribing method or a mechanical scribing method to form the second groove G2. The second groove G2 is respectively formed in the second pattern region P2 of the first longitudinal pattern VP1 and the second longitudinal pattern VP2, and in the fifth pattern region P5 of the transverse pattern HP.

Referring to FIG. 3 and FIG. 6, the second electrode 150 to be filled in the second groove G2 is formed on the semiconductor layer 140. Next, the second electrode 150 and the semiconductor layer 140 are patterned through a laser scribing method or a mechanical scribing method to form the third groove G3. The third groove G3 is respectively formed in the third pattern region P3 of the first longitudinal pattern VP1 and the second longitudinal pattern VP2, and in the sixth pattern region P6 of the transverse pattern HP.

Next, the insulating patterns I1 and I2 of FIG. 1 are formed along the dotted lines DL shown in FIG. 3. The second electrode 150, the semiconductor layer 140, and the first electrode 110 are patterned by the laser scribing method or the mechanical scribing method to form the fourth groove G4 in the insulating patterns I1 and I2. To connect the first sub-module SUB1 and the second sub-module SUB2 to each other in series, the insulating patterns I1 and I2 are not formed on the unit cell C50 at the edge of the first sub-module SUB1 and the unit cell C51 at the edge of the second sub-module SUB2.

Figure 7:
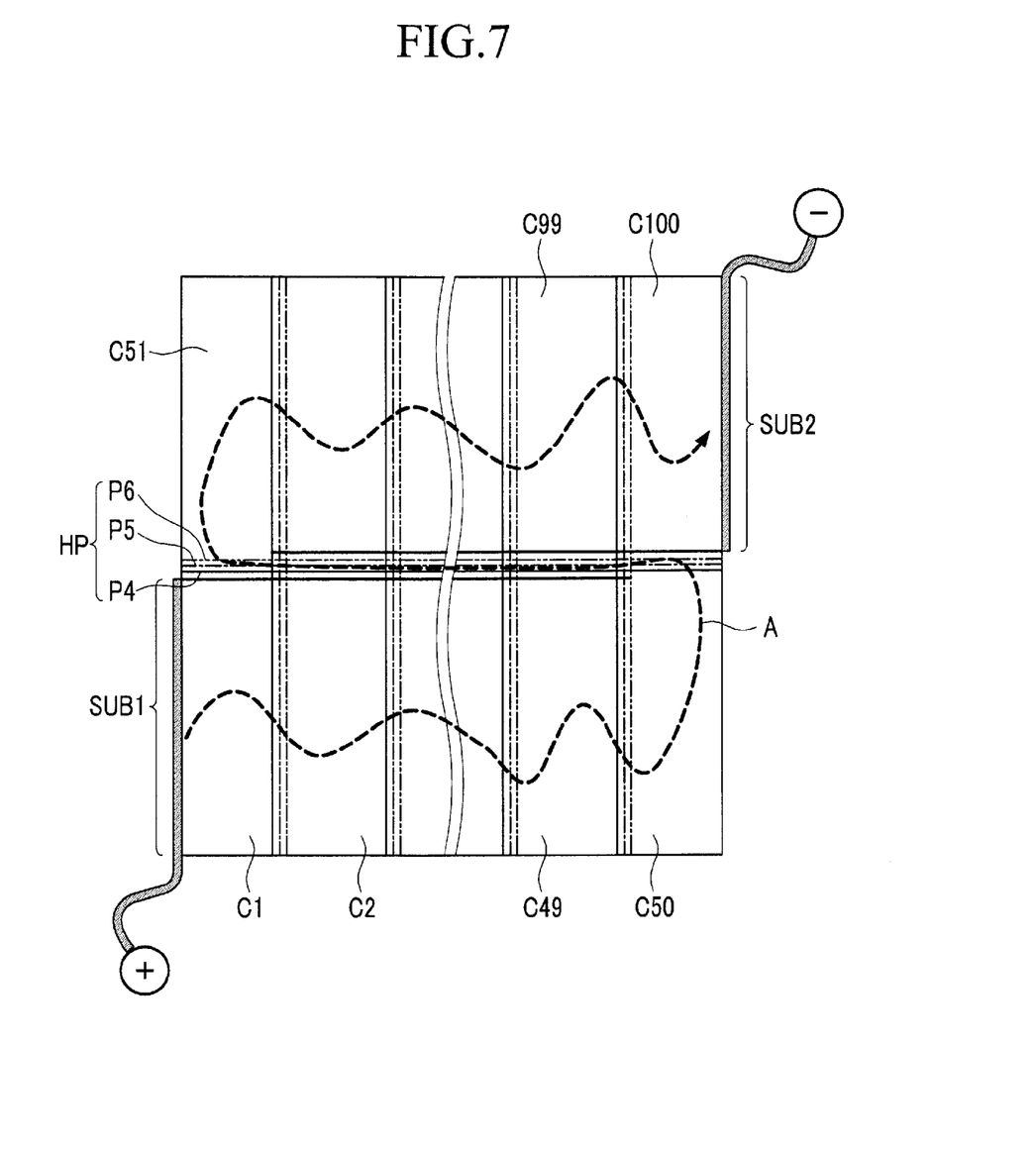
FIG. 7 is a layout view for explaining an operation of a solar cell module according to an exemplary embodiment of the present invention.

FIG. 7 is a layout view for explaining the solar cell module operation according to an exemplary embodiment of the present invention.

Referring to FIG. 7, when a positive terminal is connected to the first sub-module SUB1 and a negative terminal is connected to the second sub-module SUB2, electrons move according to the direction of the arrow A. The electrons having started from the unit cell C1 of the first sub-module SUB1 which is connected directly to the positive terminal pass through the unit cell C50, and moved to the unit cell C51 of the second sub-module SUB2 connected directly to the unit cell C50 through the transverse pattern HP. The electrons pass the unit cell C100 while moving through the second sub-module SUB2, and are transferred through the negative terminal. As a result, the connection is formed in series from the first unit cell C1 to the last unit cell C100.

Figure 8:
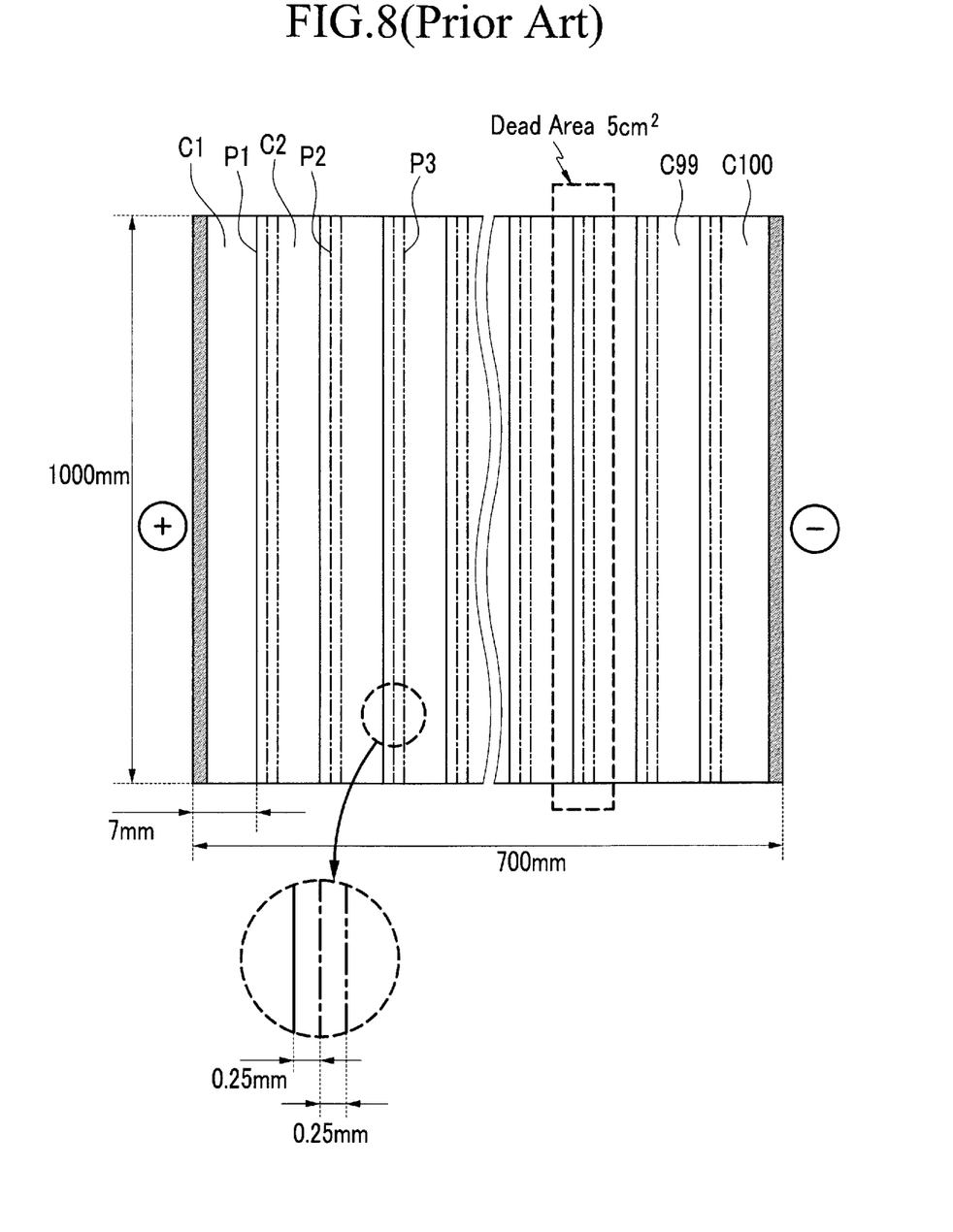
FIG. 8 and FIG. 9 are layout views comparing the dead areas according to an exemplary embodiment of the present invention (FIG. 9) to those of the conventional arts (FIG. 8).
Figure 9:
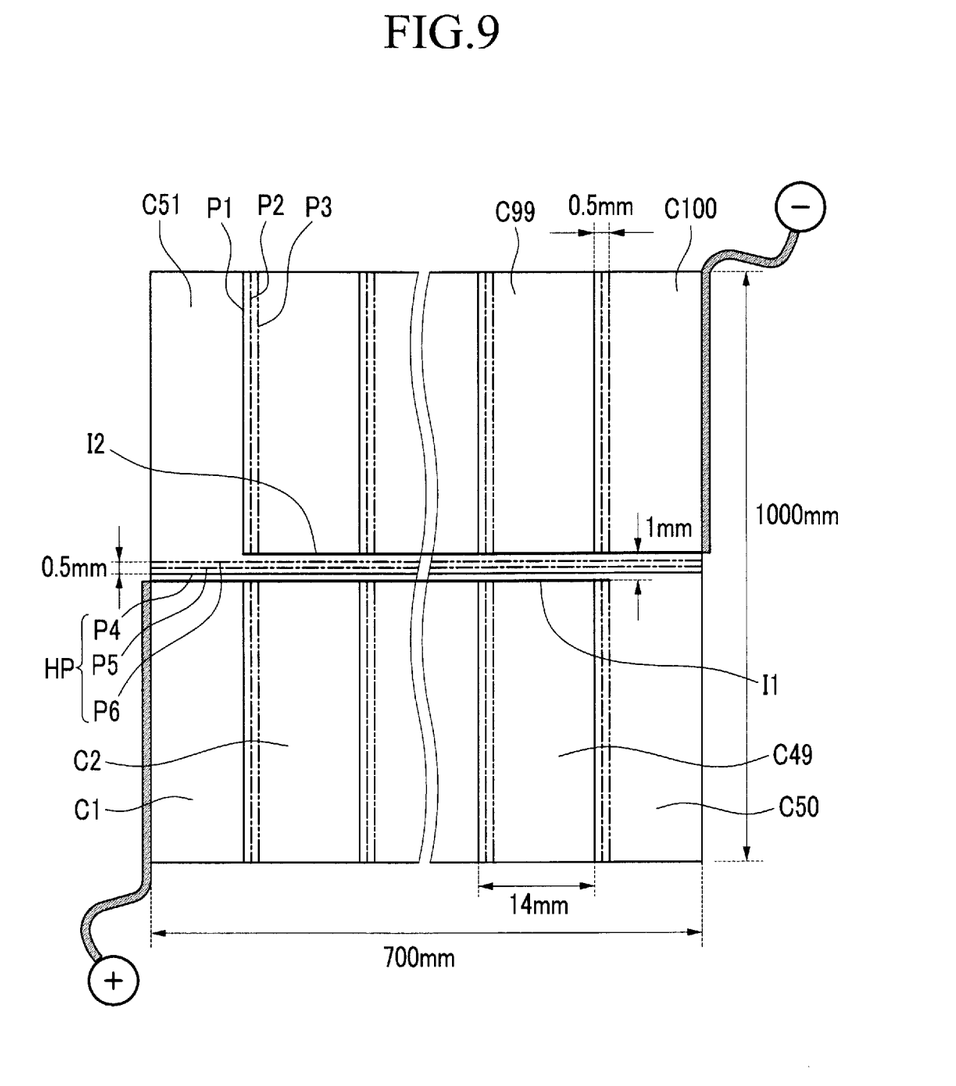

FIG. 8 and FIG. 9 are layout views to compare the effects according to an exemplary embodiment of the present invention to those of the conventional arts. In detail, FIG. 8 represents a conventional standard of the solar cell module, and FIG. 9 represents a standard of the solar cell module according to an exemplary embodiment of the present invention.

Referring to FIG. 8, the module must be equally divided into 100 unit cells of 0.6V output to achieve a total output of 60V in manufacturing a solar cell module of 70 cm×100 cm in size. Here, the entire module area less dead area that is formed by the patterning can generate electricity. In detail, the dead region of the solar cell module shown in FIG. 8 is $0.05*100*99=495$ cm$^2$, and the area that can generate electricity is reduced to 6505 cm$^2$ after subtracting the dead region of 495 cm$^2$ from the entire area of 7000 cm$^2$. An area reduction of about 7.1% is therefore generated. Even worse, the loss rate increases with the size of the module.

Referring to FIG. 9, the width of each unit cell of the module is about two times the width of each unit cell in the module shown in FIG. 8 when the module has the same total size as the module shown in FIG. 8. The unit cell C50 and the unit cell C51 are formed to be connected in series through the transverse pattern HP that has a width of 1 mm in the central part of the module. Thus, although there are 100 unit cells in FIG. 9, the same as in FIG. 8, to generate the same voltage, the pattern area is decreased by about 50%. Accordingly, more solar power is generated.

In detail, the dead region of the solar cell module shown in FIG. 9 is about 248 cm$^2$ ($0.05*70+0.05*99.9*49$), and the area that can generate electricity is 6752 cm$^2$ after subtracting the dead region of 248 cm$^2$ from the total area of 7000 cm$^2$. A decrease in dead region by about 3.5% boosts the entire output by about 3.5% over the conventional module shown in FIG. 8. Accordingly, the cost for manufacturing the module is decreased.

Figure 10:
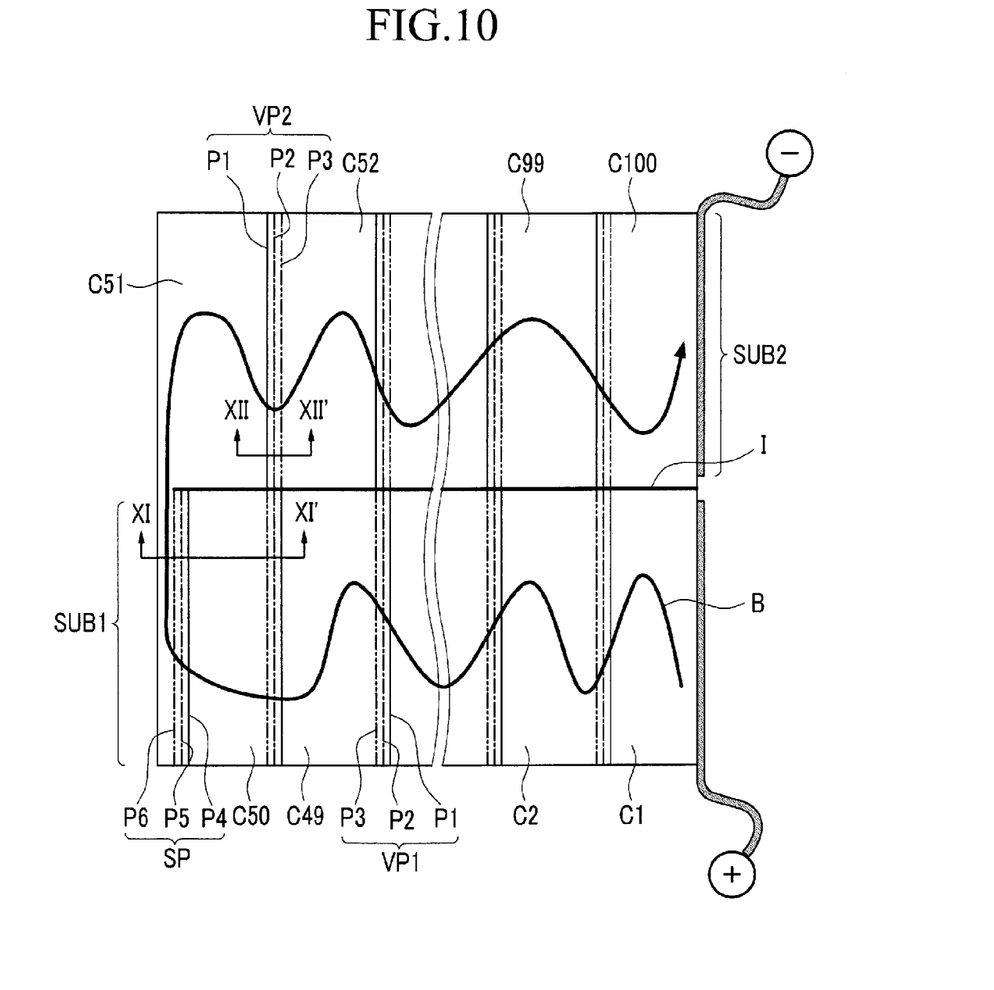
FIG. 10 is a layout view of a solar cell module according to another exemplary embodiment of the present invention.
Figure 11:
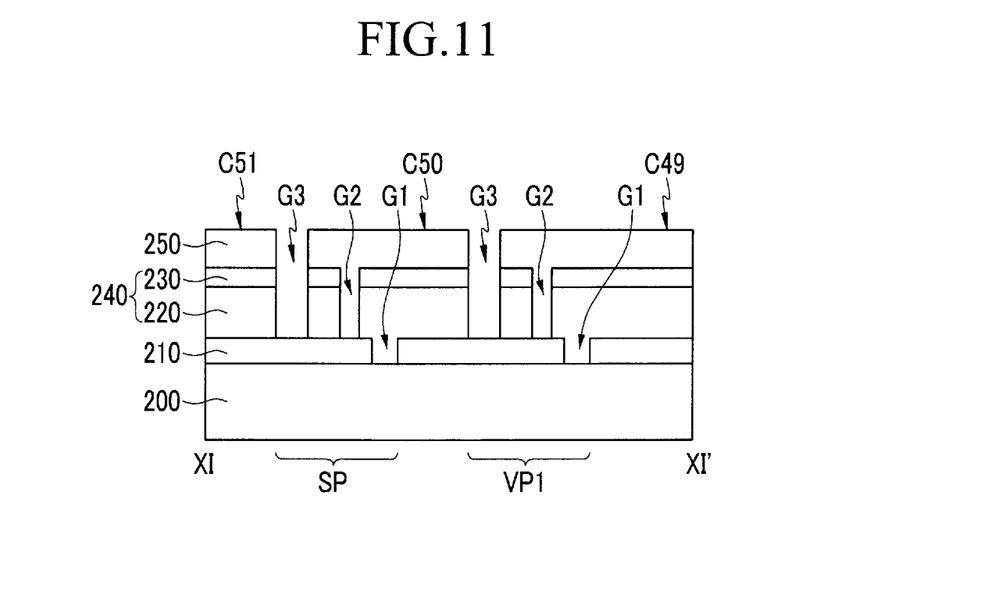
FIG. 11 is a cross-sectional view taken along the line XI-XI' of FIG. 10.
Figure 12:
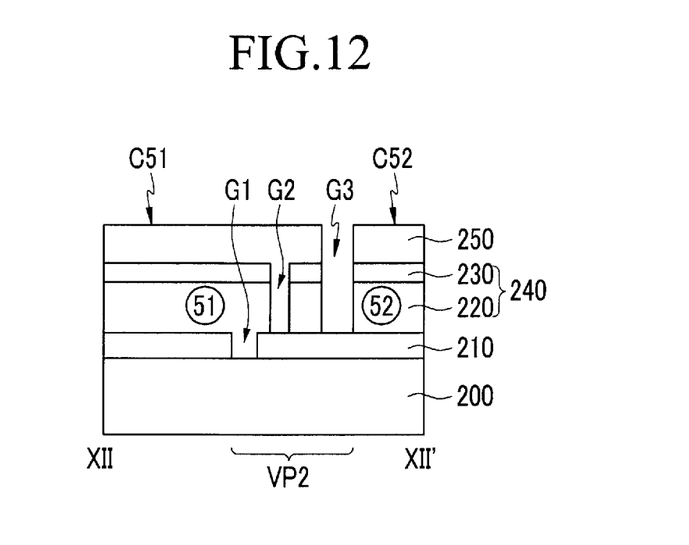
FIG. 12 is a cross-sectional view taken along the line XII-XII' of FIG. 10.

FIG. 10 is a layout view of a solar cell module according to another exemplary embodiment of the present invention. FIG. 11 is a cross-sectional view taken along the line XI-XI' of FIG. 10. FIG. 12 is a cross-sectional view taken along the line XII-XII' of FIG. 10.

Referring to FIG. 10 to FIG. 12, a solar cell module according to the current exemplary embodiment of the present invention is similar to the exemplary embodiment described through FIG. 1 and FIG. 2. However, in the exemplary embodiment of FIG. 10 to FIG. 12, a transverse pattern does not exist between the first sub-module SUB1 and the second sub-module SUB2, and only an insulating pattern I is formed. Also, an assistance pattern SP is formed in the edge unit cell C50 opposite to the terminal of the first sub-module SUB1.

In the solar cell module according to the current exemplary embodiment of the present invention, a first electrode 210 is disposed on a substrate 200 made of glass or plastic. A first groove G1 is formed passing through the first electrode 210. A semiconductor layer 240 filled in the first groove G1 may be disposed on the first electrode 210. A second groove G2 is formed passing through the semiconductor layer 240. A second electrode 250 filled in the second groove G2 may be disposed on the semiconductor layer 240. A third groove G3 is formed passing through the second electrode 250 and the semiconductor layer 240.

In detail, the first groove G1 is disposed in a first pattern region P1 extending in a longitudinal direction. The second groove G2 is disposed in a second pattern region P2 extending in the longitudinal direction. The third groove G3 is disposed in a third pattern region P3 extending in the longitudinal direction.

The first to third pattern regions P1, P2, and P3, included in the first longitudinal pattern VP1, and the first to third pattern regions P1, P2, and P3, included in the second longitudinal pattern VP2, are sequentially disposed in the same directions. The assistance pattern SP is formed in the edge unit cell C50 of the first sub-module SUB1, and the assistance pattern SP includes a fourth pattern region P4, a fifth pattern region P5, and a sixth pattern region P6.

Like the first longitudinal pattern VP1, the first groove G1 is formed in the fourth pattern region P4 extending in the longitudinal direction. The second groove G2 is formed in the fifth pattern region P5 extending in the longitudinal direction. The third groove G3 is formed in the sixth pattern region P6 extending in the longitudinal direction.

The semiconductor layer 240 includes a p layer 220 having a P-type impurity and an n layer 230 having an N-type impurity that are sequentially deposited. The p layer 220 may be made of CuInSe$_2$ (CIS) or CuInGaSe$_2$ (GIGS), and the n layer 230 may be made of CdS. However, differently from an exemplary embodiment of the present invention, the p layer 220 of the semiconductor layer 240 may also be made of one of the following: amorphous silicon (a-Si:H) doped with boron, amorphous silicon carbide (a-SiC:H), and microcrystalline silicon (mc-Si:H). The n layer 230 may be made of amorphous silicon (a-Si:H). Here, an I layer made of an amorphous material may be formed between the p layer 220 and the n layer 230.

The insulating pattern I is formed along the transverse direction on the portion where the first sub-module SUB1 and the second sub-module SUB2 are divided. The insulating pattern I extends up to the sixth pattern region P6 of the assistance pattern SP to divide the first sub-module SUB1 from the second sub-module SUB2. According to an exemplary embodiment of the present invention, a portion of the edge unit cell C51 in the second sub-module SUB2 is extended to the first sub-module SUB1. The unit cell C51 plays a function of a connection cell, connecting in series to the unit cell C50 through the assistance pattern SP.

The electrons move in the direction indicated by the arrow B shown in FIG. 10. The connection is formed in series from the unit cell C1 to the unit cell C100. According to another exemplary embodiment, the assistance pattern SP is disposed at the edge of unit cell 51 (not shown), such that the unit cell C50 may function as the connection cell.

Figure 13:
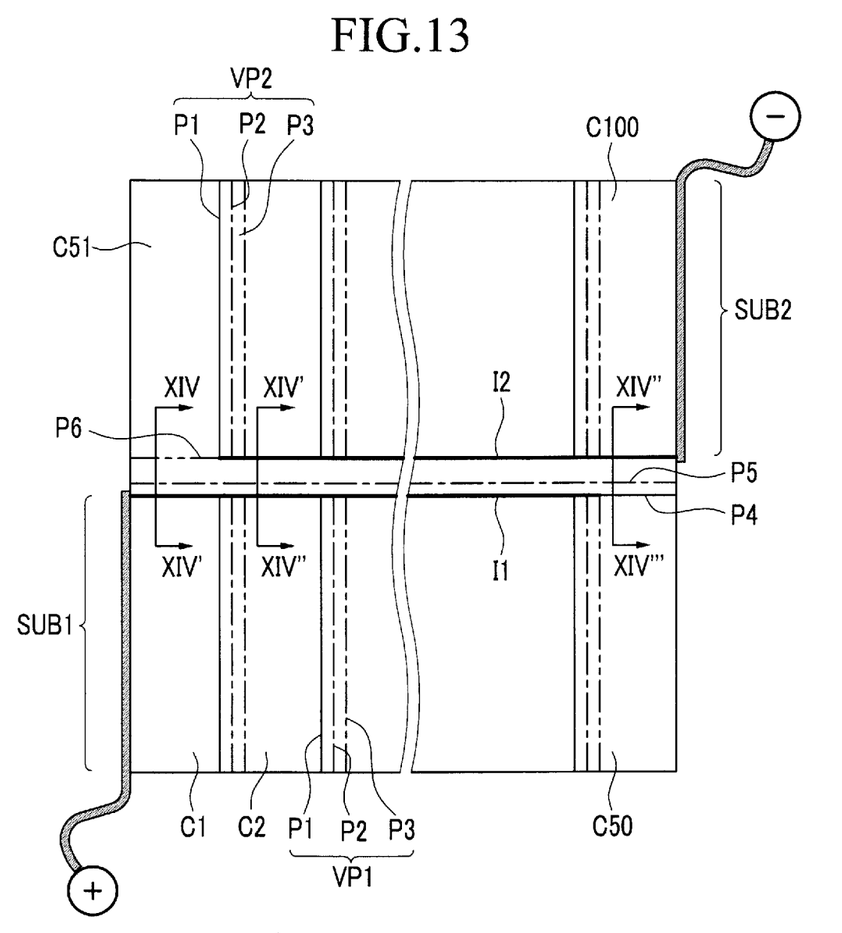
FIG. 13 is a layout view of a solar cell module according to another exemplary embodiment of the present invention.
Figure 14:
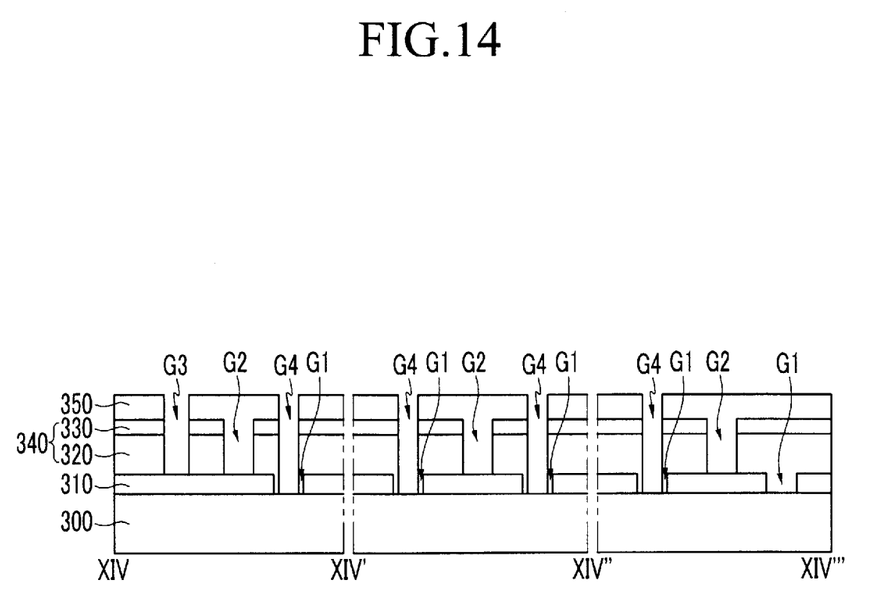
FIG. 14 is a cross-sectional view taken along the lines XIV-XIV', XIV'-XIV'', and XIV''-XIV''' of FIG. 13.

FIG. 13 is a layout view of a solar cell module according to another exemplary embodiment of the present invention. FIG. 14 is a cross-sectional view taken along the lines XIV-XIV', XIV'-XIV'' and XIV''-XIV''' of FIG. 13.

Referring to FIG. 13 to FIG. 14, in a solar cell module according to an exemplary embodiment of the present invention, a first electrode 310 is disposed on a substrate 300 made of glass or plastic. A first groove G1 is formed passing through the first electrode 310. A semiconductor layer 340 filled in the first groove G1 may be disposed on the first electrode 310. A second groove G2 is formed passing through the semiconductor layer 340. A second electrode 350 filled in the second groove G2 may be disposed on the semiconductor layer 340.

A third groove G3 is formed passing through the second electrode 350 and the semiconductor layer 340. The third groove G3 is disposed in the third pattern region P3 extending in a longitudinal direction and the sixth pattern region P6 extending in a transverse direction.

In detail, the first groove G1 is disposed in the first pattern region P1 extending in a longitudinal direction and the fourth pattern region P4 extending in a transverse direction. The fourth pattern regions P4 are formed one by one with a uniform interval therebetween in the first sub-module SUB1 and the second sub-module SUB2. The first groove G1 disposed in the fourth pattern region formed in the second sub-module SUB2 does not extend to the unit cell C51. The second groove G2 is disposed in the second pattern region P2 extending in the longitudinal direction and the fifth pattern region P5 extending in the transverse direction.

According to an exemplary embodiment of the present invention, a solar cell module may be divided into a first sub-module SUB1 and a second sub-module SUB2. In the first sub-module SUB1, the first pattern region P1, the second pattern region P2, and the third pattern region P3 make up the first longitudinal pattern VP1. In the second sub-module SUB2, the first pattern region P1, the second pattern region P2, and the third pattern region P3 make up the second longitudinal pattern VP2. In the first longitudinal pattern VP1 and the second longitudinal pattern VP2, the first pattern region P1, the second pattern region P2, and the third pattern region P3 are sequentially disposed in the same direction.

The first sub-module SUB1 and the second sub-module SUB2 include a plurality of unit cells C1, C2, ..., C100. The unit cells C1, ..., C50 of the first sub-module are divided by the first longitudinal pattern VP1, and the unit cells C51, ..., C100 of the second sub-module are divided by the second longitudinal pattern VP2.

A fourth pattern region P4 of the first sub-module SUB1 contacts the first longitudinal pattern VP1. Also, the fourth pattern region P4 of the second sub-module SUB2 contacts the second longitudinal pattern VP2. The fourth pattern region P4 of the first sub-module SUB1 is formed for all unit cells of the first sub-module SUB1, however the fourth pattern region P4 of the second sub-module SUB2 is not formed in the unit cell C51 at the edge of the second sub-module SUB2. As a substitute, the sixth pattern region P6 is formed in the transverse direction in the unit cell C51. In addition, insulating patterns I1 and I2 are formed respectively overlapping the fourth pattern regions P4 of the first sub-module SUB1 and the second sub-module SUB2. The insulating patterns I1 and I2 have the fourth groove G4 passing through the second electrode 350, the semiconductor layer 340, and the first electrode 310. However, the insulating pattern I1 of the first sub-module SUB1 is not formed in the unit cell C50 at the edge of the first sub-module SUB1. Unit cell C50 is connected in series to unit cell C51 of the second sub-module SUB2.

The semiconductor layer 340 includes a p layer 320 having a P-type impurity and an n layer 330 having an N-type impurity that are sequentially deposited. The p layer 320 may be made of $CuInSe_2$ (CIS) or $CuInGaSe_2$ (CIGS), and the n layer 330 may be made of CdS. However, differently from an exemplary embodiment of the present invention, the p layer 320 of the semiconductor layer 240 may be made of one of the following: amorphous silicon (a-Si:H) doped with boron, amorphous silicon carbide (a-SiC:H), and microcrystalline silicon (mc-Si:H). Also, the n layer 130 may be made of amorphous silicon (a-Si:H). Here, an I layer (not shown) made of an amorphous material may be formed between the p layer 120 and the n layer 130.

Figure 15:
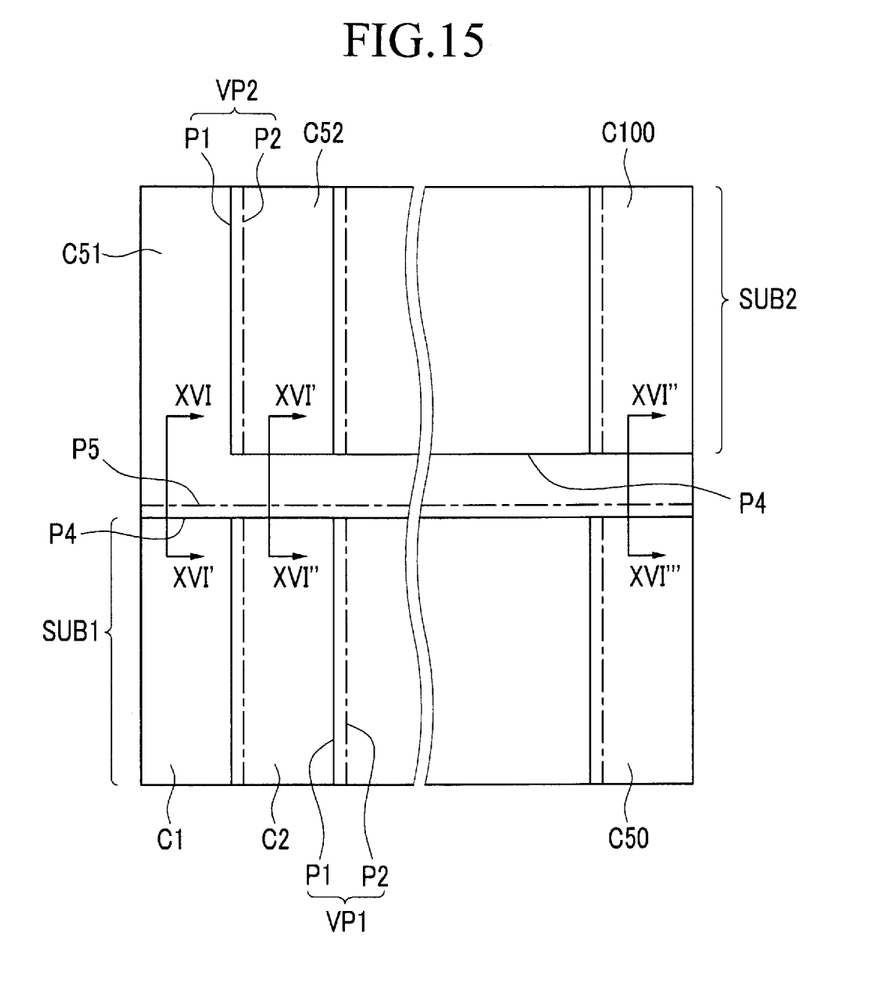
FIG. 15 is a layout view of a solar cell module in a manufacturing method according to the exemplary embodiment of FIG. 13.
Figure 16:
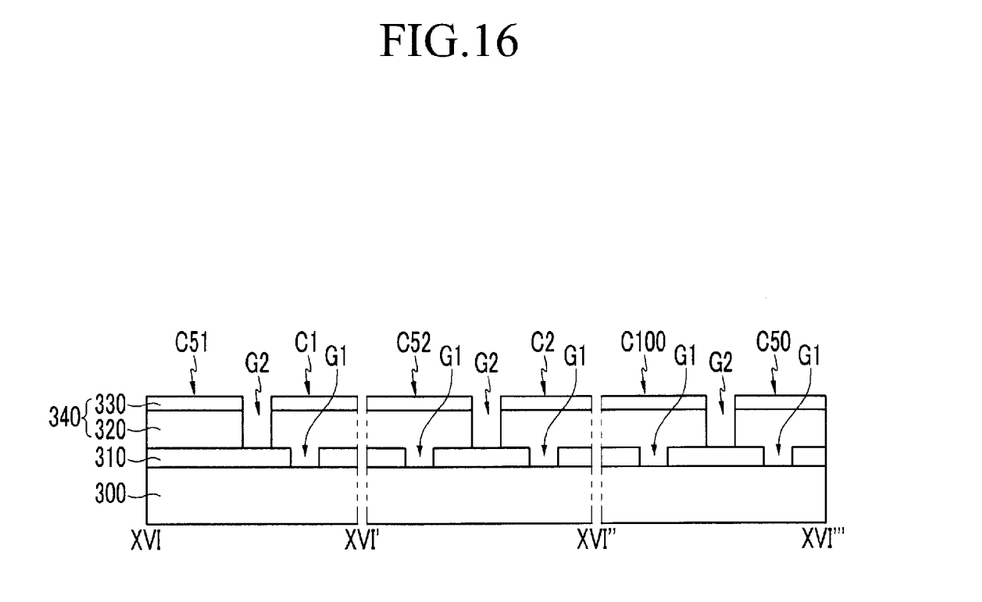
FIG. 16 is a cross-sectional view taken along the lines XVI-XVI', XVI'-XVI'', and XVI''-XVI''' of FIG. 15.

FIG. 15 is a layout view of a solar cell module manufactured using a method similar to that of the exemplary embodiment of FIG. 13. FIG. 16 is a cross-sectional view taken along the lines XVI-XVI', XVI'-XVI'' and XVI''-XVI''' of FIG. 15.

Referring to FIG. 15 and FIG. 16, the first electrode 310 is deposited on a substrate 300 by using a sputtering method. Next, the first electrode 310 is patterned through a laser scribing method or a mechanical scribing method to form the first groove G1. The first groove G1 is respectively formed in the first pattern region P1 of the first longitudinal pattern VP1 and the second longitudinal pattern VP2, and the fourth pattern region P4 of the first sub-module SUB1 and the second sub-module SUB2. The fourth pattern region P4 may be formed substantially perpendicular to the first longitudinal pattern and the second longitudinal pattern. Here, the fourth pattern region P4 of the second sub-module SUB2 is not formed in the unit cell C51.

Next, a semiconductor layer 340 to be filled in the first groove G1 is formed. Then the semiconductor layer 340 is patterned through a laser scribing method or a mechanical scribing method to form the second groove G2. The second groove G2 is respectively formed in the second pattern region P2 of the first longitudinal pattern VP1 and the second longitudinal pattern VP2, and in the fifth pattern region P5 with the transverse pattern HP.

Referring to FIG. 13 and FIG. 14, the second electrode 350 to be filled in the second groove G2 is formed on the semiconductor layer 340. Next, the second electrode 350 and the semiconductor layer 340 are patterned through a laser scribing method or a mechanical scribing method to form the third groove G3. The third groove G3 is respectively formed in the third pattern region P3 of the first longitudinal pattern VP1 and the second longitudinal pattern VP2, and in the sixth pattern region P6 with the transverse pattern HP.

Here, the second electrode 350, the semiconductor layer 340, and the first electrode 310 are simultaneously patterned in forming the third groove G3 in the transverse direction and the fourth groove G4. The fourth groove G4 is formed to keep the insulating patterns I1 and I2 overlapping the fourth pattern region P4. To connect the first sub-module SUB1 and the second sub-module SUB2 in series, the insulating patterns I1 and I2 are not formed in the edge unit cell C50 of the first sub-module SUB1 and the edge unit cell C51 of the second sub-module SUB2. The fourth groove G4 may be formed by irradiating a laser up from under the substrate 300.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell module comprising:
    a substrate;
    a plurality of unit cells, each cell including a first electrode, a semiconductor layer, and a second electrode that are sequentially deposited on the substrate;
    a first sub-module and a second sub-module having the unit cells, respectively, the first sub-module including first to N-th unit cells that are sequentially disposed, and the second sub-module including (N+1)-th to 2N-th unit cells that are sequentially disposed, the first to N-th unit cells and the (N+1)-th to 2N-th unit cells are sequentially disposed along the same direction;
    a first longitudinal pattern dividing the unit cells of the first sub-module, and a second longitudinal pattern dividing the unit cells of the second sub-module, wherein the first longitudinal pattern and the second longitudinal pattern respectively include: a first pattern region patterned in a longitudinal direction to pass through the first electrode; a second pattern region patterned in the longitudinal direction to pass through the semiconductor layer; and a third pattern region patterned in the longitudinal direction to pass through the semiconductor layer and the second electrode;
    a transverse pattern dividing the first sub-module and the second sub-module, the transverse pattern including the first electrode, the semiconductor layer, and the second electrode extending along an entire length of the transverse pattern dividing the first sub-module and the second sub-module, wherein the transverse pattern includes: a fourth pattern region patterned in a transverse direction to pass through the first electrode; a fifth pattern region patterned in the transverse direction to pass through the semiconductor layer; and a sixth pattern region patterned in the transverse direction to pass through the semiconductor layer and the second electrode; and
    an insulating portion disposed near the transverse pattern and insulating between the first sub-module and the second sub-module,
    wherein;
    the unit cells of the first sub-module are connected in series through the first longitudinal pattern,
    the unit cells of the second sub-module are connected in series through the second longitudinal pattern, and
    the N-th unit cell of the first sub-module and the (N+1)-th unit cell of the second sub-module are connected in series through the transverse pattern.

2. The solar cell module of claim 1, wherein
the insulating portion includes a first insulating portion disposed on a straight line with the fourth pattern region and a second insulating portion disposed on a straight line with the sixth pattern region.

3. The solar cell module of claim 1, wherein
the first pattern region, the second pattern region, and the third pattern region patterned in the longitudinal direction are sequentially disposed in a transverse direction in the first sub-module and the second sub-module, respectively.

4. The solar cell module of claim 3, wherein
a first unit cell of the edge of the first sub-module and a second unit cell of the edge of the second sub-module separated from the first unit cell are connected in series through the transverse pattern.

5. The solar cell module of claim 4, wherein
the first unit cell at the edge of the first sub-module and the second unit cell at the edge of the second sub-module are separated from each other along a diagonal direction.

6. The solar cell module of claim 3, wherein
a first unit cell at the edge of the first sub-module and a second unit cell at the edge of the second sub-module neighboring the first unit cell are connected in series through the transverse pattern.

7. The solar cell module of claim 1, wherein
the transverse pattern includes a first insulating portion near the first sub-module and a second insulating portion near the second sub-module.

8. The solar cell module of claim 7, wherein
the first insulating portion is disposed from the first unit cell to the (N−1)-th unit cell, and the second insulating portion is disposed from the (N+2)-th unit cell to 2N-th unit cell.

9. The solar cell module of claim 1, wherein
the unit cells have the same area.

* * * * *